United States Patent
Doberenz

(12) 
(10) Patent No.: US 6,753,710 B2
(45) Date of Patent: *Jun. 22, 2004

(54) METHOD AND APPARATUS FOR GENERATING A CLOCK SIGNAL

(75) Inventor: Philip W. Doberenz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/293,424

(22) Filed: Nov. 12, 2002

(65) Prior Publication Data

US 2003/0076147 A1 Apr. 24, 2003

Related U.S. Application Data

(63) Continuation of application No. 09/541,446, filed on Mar. 31, 2000.

(51) Int. Cl.[7] .................................................. H03L 7/06
(52) U.S. Cl. ........................ 327/150; 327/153; 327/159; 327/291
(58) Field of Search .............................. 327/147, 148, 327/149, 150, 153, 156, 157–159, 161, 284, 395, 398, 400, 2, 3, 5, 7, 291; 331/17, 25; 375/375, 376

(56) References Cited

U.S. PATENT DOCUMENTS

| 4,797,585 | A | * | 1/1989 | Segawa et al. ............. 327/172 |
| 5,164,966 | A | * | 11/1992 | Hershberger ................ 375/110 |
| 5,223,755 | A | * | 6/1993 | Richley ...................... 327/158 |
| 5,268,594 | A | * | 12/1993 | Huang ........................ 327/172 |
| 5,347,232 | A | * | 9/1994 | Nishimichi .................. 331/1 A |
| 5,432,480 | A | * | 7/1995 | Popescu ...................... 331/11 |
| 5,726,595 | A | * | 3/1998 | Lin et al. .................... 327/155 |
| 5,900,761 | A | * | 5/1999 | Hideno et al. .............. 327/261 |
| 5,929,682 | A | * | 7/1999 | Kazuya et al. .............. 327/291 |
| 6,018,259 | A | * | 1/2000 | Lee ............................. 327/159 |
| 6,034,554 | A | * | 3/2000 | Francis et al. ................ 327/7 |
| 6,147,561 | A | * | 11/2000 | Rhee et al. ................... 331/12 |
| 6,150,859 | A | * | 11/2000 | Park ........................... 327/158 |
| 6,239,641 | B1 | * | 5/2001 | Lee ............................. 327/270 |
| 6,285,172 | B1 | * | 9/2001 | Torbey ....................... 323/237 |
| 6,292,016 | B1 | * | 9/2001 | Jefferson et al. ............. 326/39 |
| 6,583,653 | B1 | * | 6/2003 | Doberenz ................... 327/150 |

* cited by examiner

Primary Examiner—Timothy P. Callahan
Assistant Examiner—Hai L. Nguyen
(74) Attorney, Agent, or Firm—Michael J. Nesheiwat

(57) ABSTRACT

In accordance with one embodiment of the invention a circuit includes a split delay-chain, a phase detector, and a voltage controlled oscillator (VCO) coupled so as to produce a clock signal based on a non-external reference.

12 Claims, 7 Drawing Sheets

METHOD AND APPARATUS FOR GENERATING A CLOCK SIGNAL

RELATED APPLICATION

This patent application is a continuation patent application of U.S. patent application Ser. No. 09/541,446 titled "Method and Apparatus for Generating a Clock Signal," filed on Mar. 31, 2000, by Doberenz, herein incorporated by reference and assigned to the assignee of the present invention.

BACKGROUND

1. Field

This disclosure relates to generating a clock signal.

2. Background Information

Integrated circuits (ICs), such as processors or microprocessors, for example, typically employ circuitry for providing a clock signal to elements of a circuit embodied on such an IC. Clocking, that is applying a clock signal to an IC, is well-known and, at least in part, allows the elements of an IC, such as a processor, for example, to operate synchronously or nearly synchronously. One common technique for providing such a clock signal, or clocking, an integrated circuit is to employ a clock circuit, such as, for example, a phase locked loop (PLL), a delay locked loop (DLL), or a frequency locked loop (FLL). Of course, other techniques for providing a clock signal exist. Such clock circuits are well-known to those of skill in the art and are typically configured as a feedback loop which may allow the clock signal being generated to be compared with a reference clock signal and adjusted until the two signals are "phase locked" or substantially in phase. Techniques for comparing these signals and locking such a clock circuit vary and may depend on the particular embodiment. Typically, a clock circuit embodied in an IC, such as a processor, for example, clocks the IC at some frequency multiple of an external electronic signal. This signal is often referred to as a system clock or bus clock and may be generated, for example, by well-known oscillator circuits, which may include a ceramic or crystal oscillator. As clock frequencies increase in ICs, generating such clock signals based on such an external reference signal may become problematic due, for example, to clock jitter. Clock jitter, at a high level, may be defined as phase variation in such a clock signal from one phase to another of such a signal. Therefore, alternative methods of generating a clock signal for an IC may be desirable.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As was previously indicated, integrated circuits (ICs) typically employ a scheme for generating a clock signal. One technique for accomplishing this is through the use of a clock circuit. As was previously discussed such a clock circuit may comprise, for example, a phase locked loop (PLL), a delay locked loop (DLL), or a frequency locked loop (FLL). At a high level, a PLL may be adjusted by modifying the phase of a clock signal. Likewise, DLLs and FLLs may be adjusted by modifying, respectively, the delay or the frequency of a clock signal. Such techniques for generating a clock signal are well-known to those of skill in the art.

Figure 6:
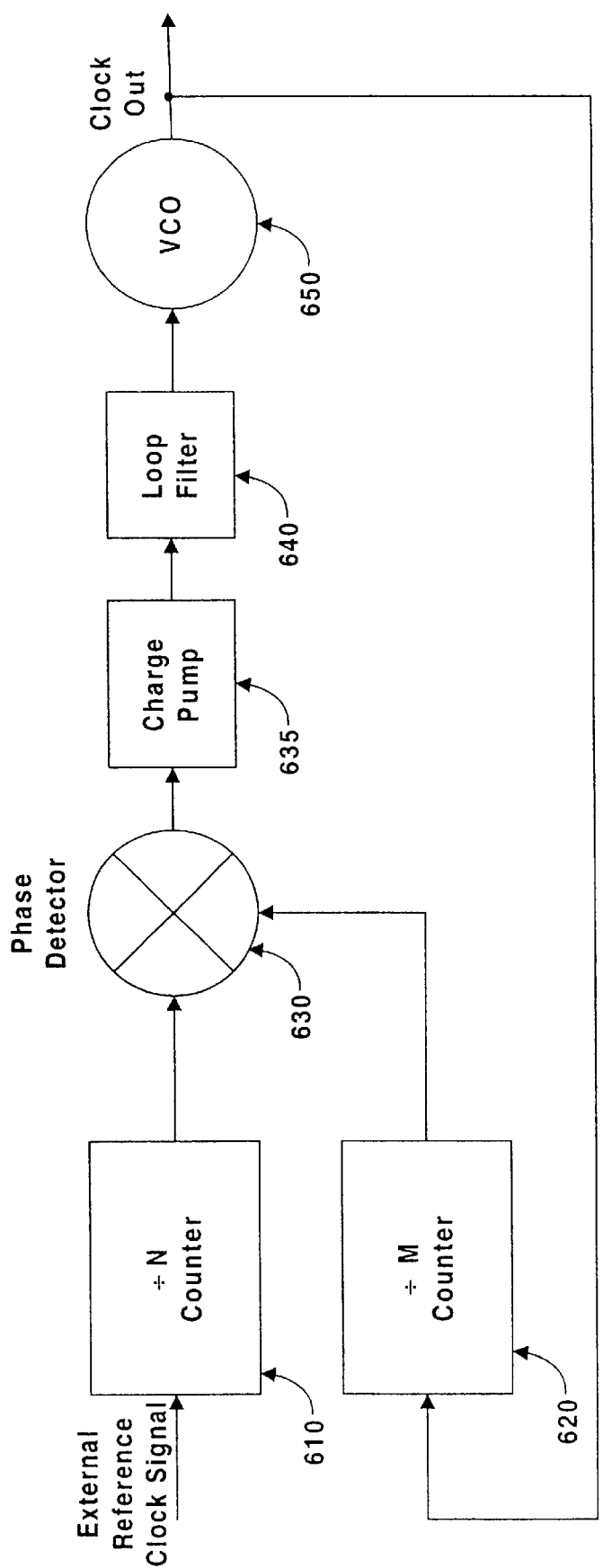
FIG. 6 is a schematic diagram illustrating a prior art embodiment of a circuit for generating a clock signal.

A prior art embodiment of such a clock circuit, 600, is illustrated in FIG. 6. As previously discussed, such clock circuits typically employ an external reference signal, which is illustrated in FIG. 6 as an input signal applied to "÷n" counter 610. Counters, such as 610, are typically programmable with a range of integer multiples. Various techniques for implementing programmable counters are possible and well-known to those of ordinary skill in the art.

In such embodiments it may be desirable to allow for non-integer multiples of the external reference clock, that is fractional multiples. This capability may be desirable, at least in part, because it may allow flexibility in adjusting the oscillation frequency of the clock signal produced by such a clock circuit. For example, if it were desirable to run a circuit, such as an IC, at 350 megahertz (MHz) using an external reference clock of 100 MHz, the applicable frequency multiplier would be 7/2, or 3.5, which may not be accomplished using a clock circuit that implements only simple multiples. This flexibility may, for example, allow the clock signal to be adjusted to account for a number of variables that may affect the performance of an IC including such a clock circuit. Some examples of such variables include IC fabrication process variation, operating temperature ranges and operating voltage ranges. Of course, other examples of variables affecting IC operation are possible. One technique to accomplish this flexibility that is commonly employed includes the use of an additional integer counter, such as a "÷m" counter, such as 620 illustrated in FIG. 6. By employing dual counters, such as 610 and 620, for example, flexibility may be obtained for achieving fractional multiples of an external reference clock signal with clock circuit 600.

In this particular embodiment, phase detector 630 compares the respective output signals from ÷n counter 610 and ÷m counter 620 to determine if the phase of the output signal being generated by clock circuit 600 is consistent with the external reference clock, where the output signal also realizes the desired frequency multiple established by counters 610 and 620. Phase detector 630 may then communicate the results of this comparison by signaling loop filter 640 via charge pump 635. The filtered phase detector signal may then result in an increase or decrease of the frequency at which voltage controlled oscillator (VCO) 650 is operating if the comparison indicates that VCO 650 is oscillating too slowly or too quickly, respectively. Again, such clock circuit schemes are well known in the art.

The embodiment illustrated in FIG. 6 does, however, have some potential disadvantages. As the frequencies of ICs increase and the operating voltages concurrently decrease, use of an external reference clock may become more difficult. These changes in the frequency and voltage ranges, although desirable, may call for an external reference clock signal that may be difficult to achieve. This may be due to a number of possible factors, such as cost, electronic system noise, power demands, and associated signal jitter, just to name a few examples. These factors may, for example, make it more difficult to design or manufacture a clock circuit, such as 600, that will operate reliably at a relatively high frequency and relatively low voltage. Clock jitter, for example, may make it more difficult for clock circuits, such as 600, to achieve the proper phase relationship, or as it is typically referred to, to achieve lock as operating frequencies increase. Clock jitter, in this context, is, at least, the variation from one clock phase to another in the relative location of signal transitions. This may be, at least in part, because the phase of the external reference signal, due to such clock jitter, may not be consistent. Clock circuit tolerance to reference clock jitter is typically inversely proportional to the target operating frequency, that is, higher frequencies may be less tolerant of reference clock jitter.

Another potential disadvantage of prior art embodiments, such as 600, is an IC may be operated at a frequency that is higher than that at which the circuit is intended to operate. This is typically referred to as over-clocking. This over-clocking is undesirable because it may potentially result in a circuit operating improperly or it may reduce the useful life of a circuit. Useful life may be reduced, at least in part, due to the circuit being operated outside the range at which it was specifically designed to operate. This, in turn, may result in, physical failure of one more elements of the IC, for example. One example of such failure may include destruction of metal interconnects in the IC due, at least in part, to excessive current from over-clocking.

Figure 5:
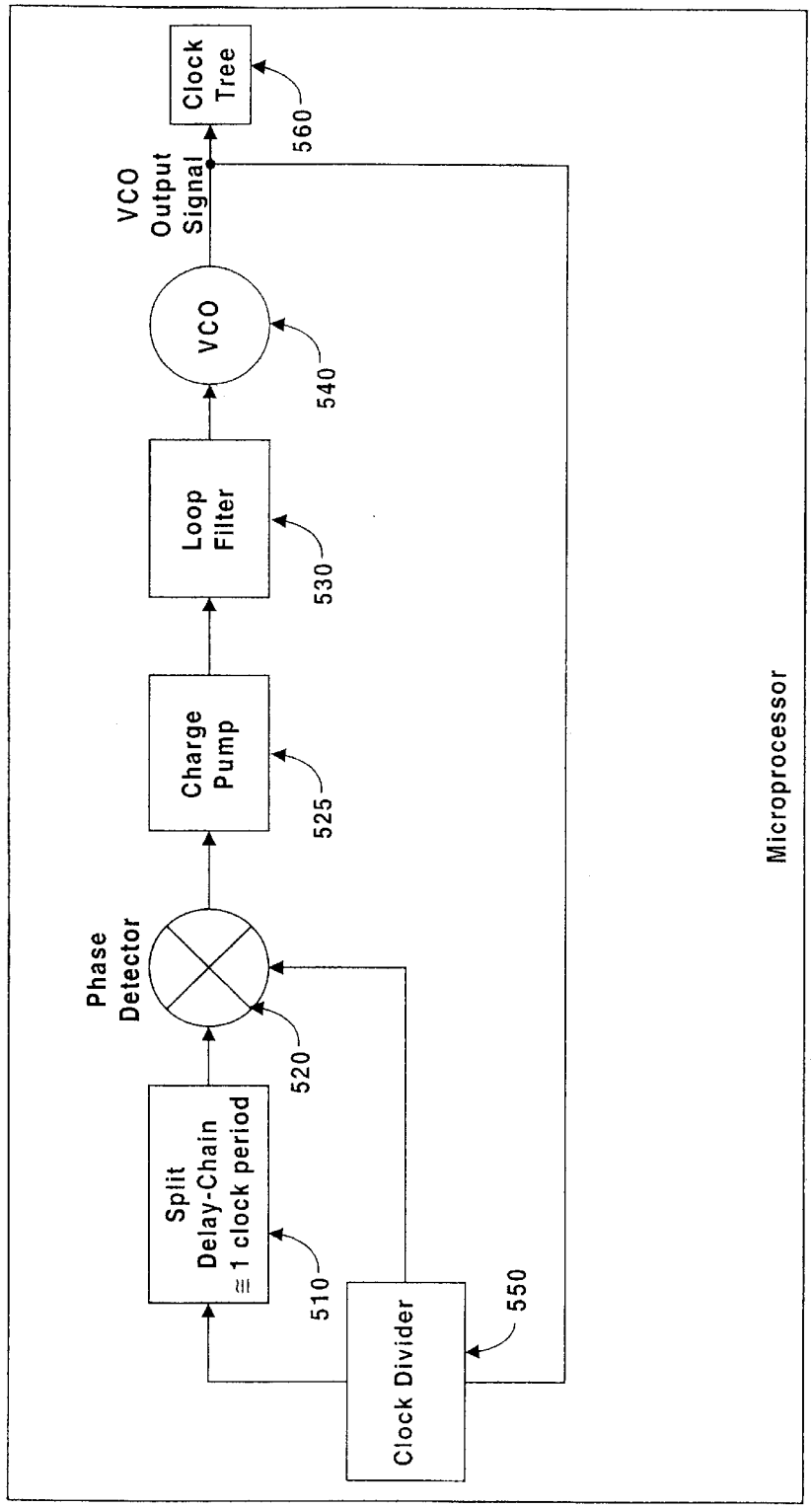
FIG. 5 is a block diagram illustrating an embodiment of a microprocessor employing a circuit in accordance with the invention.

Embodiment 500, illustrated in FIG. 5, addresses at least some of these disadvantages. FIG. 5 illustrates an embodiment of, for example, a microprocessor, 500, employing an embodiment of a circuit in accordance with the invention. In this particular embodiment, employing a non-external reference clock signal may reduce the effects of, for example, external reference clock signal jitter and/or system noise. Generating such a non-external reference clock signal may, for example, produce other advantages also, depending on the embodiment. For example, such embodiments may make over-clocking less likely or more difficult due, at least in part, to internally generating a clock signal on an IC.

As is illustrated in FIG. 5, VCO 540 is coupled, via clock divider 550, to split delay-chain 510 and phase detector 520, although the invention is not limited in scope in this respect. Clock divider 550 is an optional element and embodiments may exist that do not employ such a clock divider. Clock divider 550, for this embodiment, may comprise logic circuitry and employed to provide signals to, at least, split delay-chain 510 and phase detector 520. These signals, for this embodiment, have corresponding phase relationships that facilitate phase comparison. The invention, of course, is not limited in scope in this respect as alternative techniques for providing such signals with such corresponding phase relationships may exist. For example, in one possible alternative embodiment, the VCO output signal may be directly applied to split delay-chain 510 and applied to phase detector 520, for example, via an inverter.

Split-delay chain 510, in this embodiment, is capable of generating a delayed version of an output signal from VCO 540, for example, by a time substantially equivalent to a predetermined substantially fixed period that corresponds to a target frequency for the clock signal being generated by embodiment 500. For this embodiment, split delay chain 510 is also capable of being cleared between phase comparisons, which may reduce the occurrence of phase comparison errors, as will be discussed in more detail hereinafter. Of course, other configurations of a split delay chain may exist and the invention is not limited in scope to any particular configuration. In this embodiment, 500, of a clock circuit, as discussed in further detail hereinafter, the reference clock signal comprises a modified version of the output signal produced by VCO 540, rather than an external clock signal reference, such as a bus clock, for example. In this context, a clock circuit may be defined as circuit elements coupled so as to provide an alternating or oscillating signal for clocking the circuit elements of, for example, an IC. Such circuit elements may also be referred to as a clock tree, such as 560. Such clock circuits typically provide a clock signal that is substantially consistent in frequency and magnitude, however, other techniques may exist.

In this particular embodiment, split delay-chain 510 and clock divider 550 may communicate at least two signals to phase detector 520. These signals may include a reference version of a VCO output signal and a delayed version of the VCO output signal, such as indicated above, for example. For this particular embodiment, clock divider 550 and split delay-chain 510 may be employed to produce such a delayed version of a VCO output signal, based, at least in part, on a VCO output signal produced by VCO 540. Likewise, clock divider 550 may be employed to produce a reference version of the VCO output signal. The invention is, of course, not limited in scope to any particular formats for the reference or delayed versions of the VCO output signal. Depending on the particular embodiment, the reference clock signal may be a signal that is substantially equivalent to the VCO output signal, a signal that is a phase inverted version of the VCO output signal, or a signal that is the VCO output signal divided by two, as some examples. Likewise, clock divider 550 and split delay-chain 510 may provide a delayed version of the VCO output signal in any number of formats. For this embodiment, however, the reference and delayed versions of the VCO output signal are consistent in format to facilitate phase detection, as is discussed in more detail hereafter.

For embodiment 500, phase detector 520 compares the reference clock signal and the delayed version to determine whether, for example, the clock circuit is "locked." If not, this may result in the oscillation frequency of the VCO, 540, being adjusted by a filtered signal or signals from loop filter 530, for example. Various techniques for performing this phase comparison exist and the invention is not limited in scope to any particular technique. In this particular embodiment, the delayed version of the VCO output signal may be generated by one pulse of the VCO output signal and the reference version may be generated by a subsequent pulse of the VCO output signal. In this particular scenario, the delayed version may, for example, be compared with the next pulse of the VCO output signal as represented by the reference version. As a result of this phase comparison, phase detector 520 may provide an electronic signal(s) to loop filter 530 via charge pump 525, indicating the results of such a phase comparison. Of course, various techniques for performing this phase comparison and indicating the results exist and the invention is not limited in scope to any particular technique or techniques. In response to the output signal(s) from the phase detector, which is(are), in turn, filtered by loop filter 530, the oscillation frequency of VCO 540 may be adjusted if the clock circuit is running too slowly or too quickly. If the phase comparison indicates that the clock circuit is "locked", the oscillation frequency of VCO 540 would typically not be adjusted, for this embodiment. VCOs are well-known in the art and various techniques for adjusting the frequency of oscillation of such circuits is also well-known. The invention is, of course, not limited in scope to any particular oscillator, VCO, or technique for adjusting frequency of oscillation.

Figure 2:
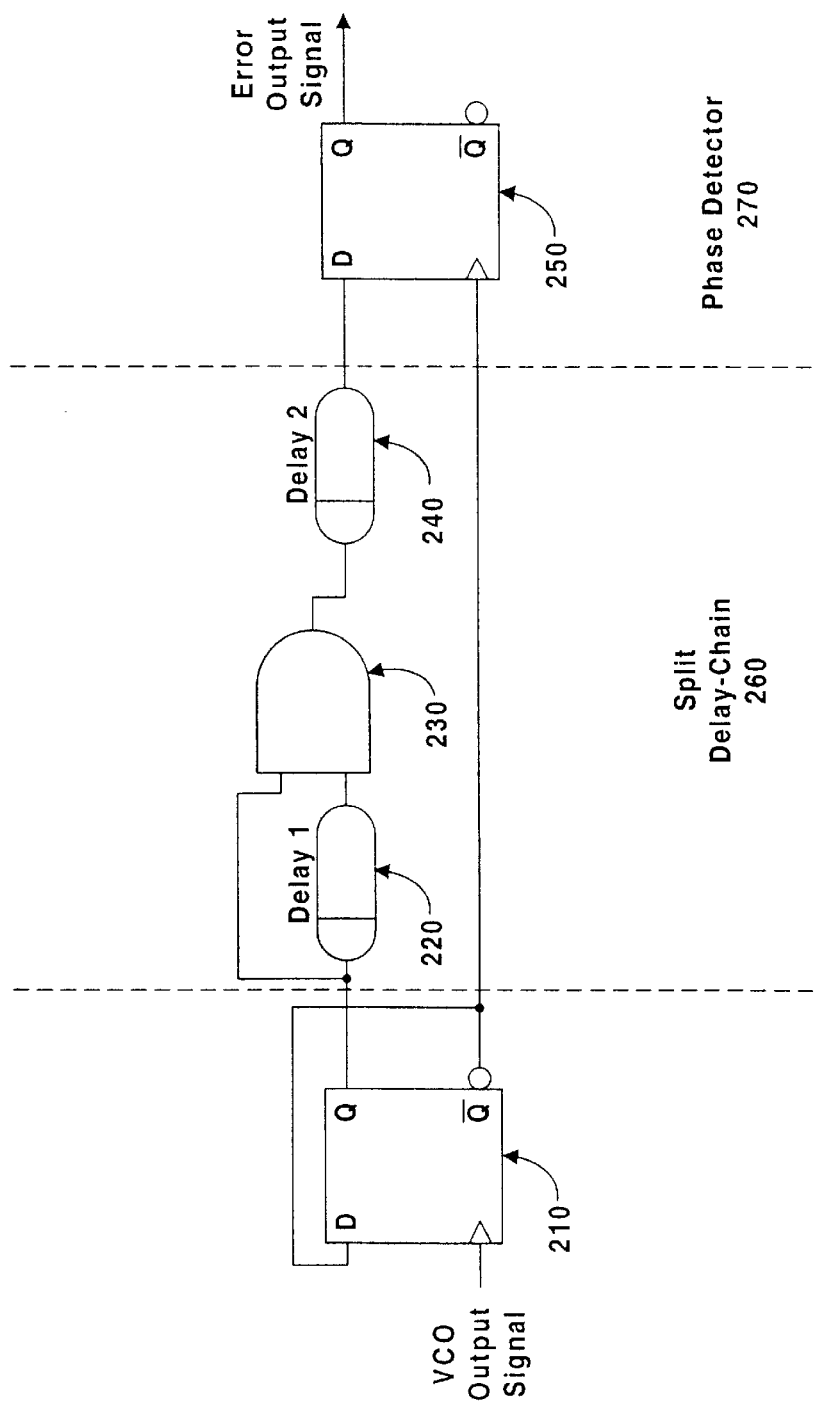
FIG. 2 is a schematic diagram illustrating a portion of another embodiment of a circuit in accordance with the invention.

FIG. 2 illustrates one embodiment, 260, of a split delay-chain as was previously described, and phase detector 270, which may be employed in an embodiment of a circuit for generating a clock signal in accordance with the invention, such as embodiment 500, for example. For this embodiment, flip-flop (FF) 210 may be employed as a clock divider, as previously described. In this configuration, it is desirable, for reasons that will be discussed in further detail hereinafter, to employ a split delay-chain to allow the delay chain to be cleared between phase comparisons. In this context, a split-delay chain may be defined as a delay device that is capable of being cleared between, for example, pulses of a VCO output signal. Such clearing may reduce the risk of, for example, phase comparison errors when such a device is employed in a clock circuit. As is discussed in more detail hereafter, if the delay chain were not cleared in such an embodiment, such phase comparison errors may result, as one example, in increasing the frequency of a VCO that may already be running at a frequency substantially faster than it is specifically designed to operate at. For the embodiment illustrated in FIG. 2, clearing split delay-chain 260 comprises transmitting a "zero" through the delay elements: 220 and 240, and the AND gate, 230, of split delay-chain 260, although the invention is not limited in scope in this respect. Clearing such a split delay-chain is discussed in more detail hereinafter.

While the invention is not limited in scope to the embodiment illustrated in FIG. 2, nor to use of this embodiment in any particular manner, such as in any particular clocking scheme, embodiment 200 illustrates one technique that may be employed in embodiments in accordance with the invention, such as 500, for generating a clock signal. For this embodiment, split delay-chain 260 comprises delay elements 220 and 240, designated Delay 1 and Delay 2, and a two input AND gate, 230. Elements 220, 230 and 240 are coupled to FF 210 so as to be capable of producing a delayed version of a VCO output signal, such as previously described. Delay elements 220 and 240 may comprise any number of different circuit elements for producing such a delay. Likewise, these elements may be included on an IC. Such elements may include, as two examples only, inverters or logic gates. The invention is, of course, not limited in scope to the use of any particular type of delay element. For this particular embodiment, FF 210 may also be employed to generate a reference version of a VCO output signal, for example. Also in this embodiment, phase detector 270 comprises FF 250, which is coupled so as to be capable of comparing the phase relationship of these signal versions of the VCO output signal, as respectively produced by split delay-chain 260 and FF 210. The output terminal, Q, of FF 250 is coupled so as to be capable of indicating the results of such a comparison to, for example, a loop filter, via a charge pump, as a signal to be filtered, as was previously described.

For this embodiment, 200, the VCO output signal is applied to the clock input terminal of FF 210. The inverted output terminal, $\overline{Q}$, and the data input terminal, D, of this FF are coupled together. $\overline{Q}$ of FF 210, which is also coupled to the clock input terminal of FF 250 included in phase detector 270, may provide the reference version of the VCO output signal. Likewise, the non-inverted output terminal, Q, of FF 210 is coupled to the input terminal of delay element 220 and one input terminal of AND gate 230 and Q of this FF may, thus, provide the delayed version of the VCO output signal via split delay-chain 260. Therefore, for this particular embodiment, the phase comparison includes comparing the delayed version of the VCO output signal with the next pulse of the reference version of the VCO output signal. Of course, the invention is not limited in scope to comparing a delayed version and a reference version of a VCO output signal and other embodiments employing such a technique are possible. As one example, such an embodiment may alternatively be employed to compare two discrete signals to determine their relative phase relationship. Such an embodiment may, for example, be useful in a control system for determining event sequences.

In this configuration, the output signals present on Q and $\overline{Q}$ of FF 210 will oscillate at one half the frequency of the VCO output signal and be 180 degrees out of phase with respect to each other. In other words, FF 210 is coupled to produce out of phase clock signal versions having half the frequency of the VCO output signal. For this embodiment, the signals employed are digital signals having two digital logic values, typically referred to as high and low, or "one" and "zero." Of course, the invention is not limited in scope to any particular digital signaling convention. The second input terminal of AND gate 230 is coupled to the output terminal of delay element 220 and the output terminal of AND gate 230 is coupled to the input terminal of delay element 240. The output terminal of delay element 240 is in turn coupled to the data input terminal, D, of FF 250 in phase detector 270. For this embodiment, the results of a phase comparison, such as described above, are provided via the non-inverted output terminal of FF 250, designated "error output signal" in FIG. 2.

For this particular embodiment, 200, a phase comparison may be performed by sampling the signal present on the output terminal of delay element 240 when the signal transmitted on $\overline{Q}$ of FF 210 transitions from 0 to 1, or the rising edge for the clock input terminal of FF 250. The delay through elements 220, 230 and 240 when transmitting a digital logic 1 may be substantially equivalent to the target period of the VCO output signal, for this embodiment. The percentage of the total delay of each delay element, 220, 230 and 240, may vary depend on the particular embodiment. In this respect, the delay for a signal to pass through an AND gate is typically fixed and would depend on the specific attributes of a process used to manufacture an IC including such gates. The invention is, of course, not limited to any particular distribution of percentages of total delay among the delay elements, the use of any particular type of delay elements, or employing a specific number of delay elements. For example, delay elements 220 and 240 may be fixed delays and, therefore, represent fixed percentages of the total delay. Alternatively, for this embodiment, one or both of the delay elements may be programmable and, therefore, represent a variable percentage of the total delay. Some potential advantages of these example embodiments are, for example, fixed delays may be less complex than programmable delays, which, in turn, may reduce overall IC complexity and silicon area die size. In contrast, programmable delays allow for more flexibility in the range of clock signal periods that may be employed by clocking schemes in accordance with the present invention, for example.

In this particular embodiment, it may be desirable that delay element 220 contributes substantially half of the total delay for split delay-chain 260. This is desirable, as it reduces the time employed to clear split delay-chain 260. For this embodiment, propagating a "zero", as was previously discussed, clears split delay-chain 260. Such a configuration may allow the split delay-chain to be cleared in a time that is less than the target period of a clock circuit employing this embodiment. For this particular embodiment, it is desirable to allocate substantially half the delay to element 220 because, at least in part, the versions of the VCO output signal being compared, as previously indicated, are half the frequency of the VCO output frequency. This configuration is advantageous in this respect, because, when a zero is propagated through the split delay-chain, that is when the split delay-chain is cleared, AND gate 230 allows delay element 220 to be bypassed, which reduces the time employed to clear the split delay-chain. This ability to clear the split delay-chain in half or less than half the target clock period may prevent phase comparison errors in such a clock circuit. In this respect, for this embodiment, the delayed version may have a duty cycle of 25% or less. Also, in this context, phase comparison errors, which are discussed in more detail hereinafter, may be defined, at least in part, as the phase detector incorrectly interpreting the results of comparing the applied signals. The invention is, of course, not limited in scope to this configuration and, alternatively, for example, the delay for a split delay-chain may be distributed among three or more delay elements and corresponding logic circuitry for clearing such a split delay-chain.

Figure 1:
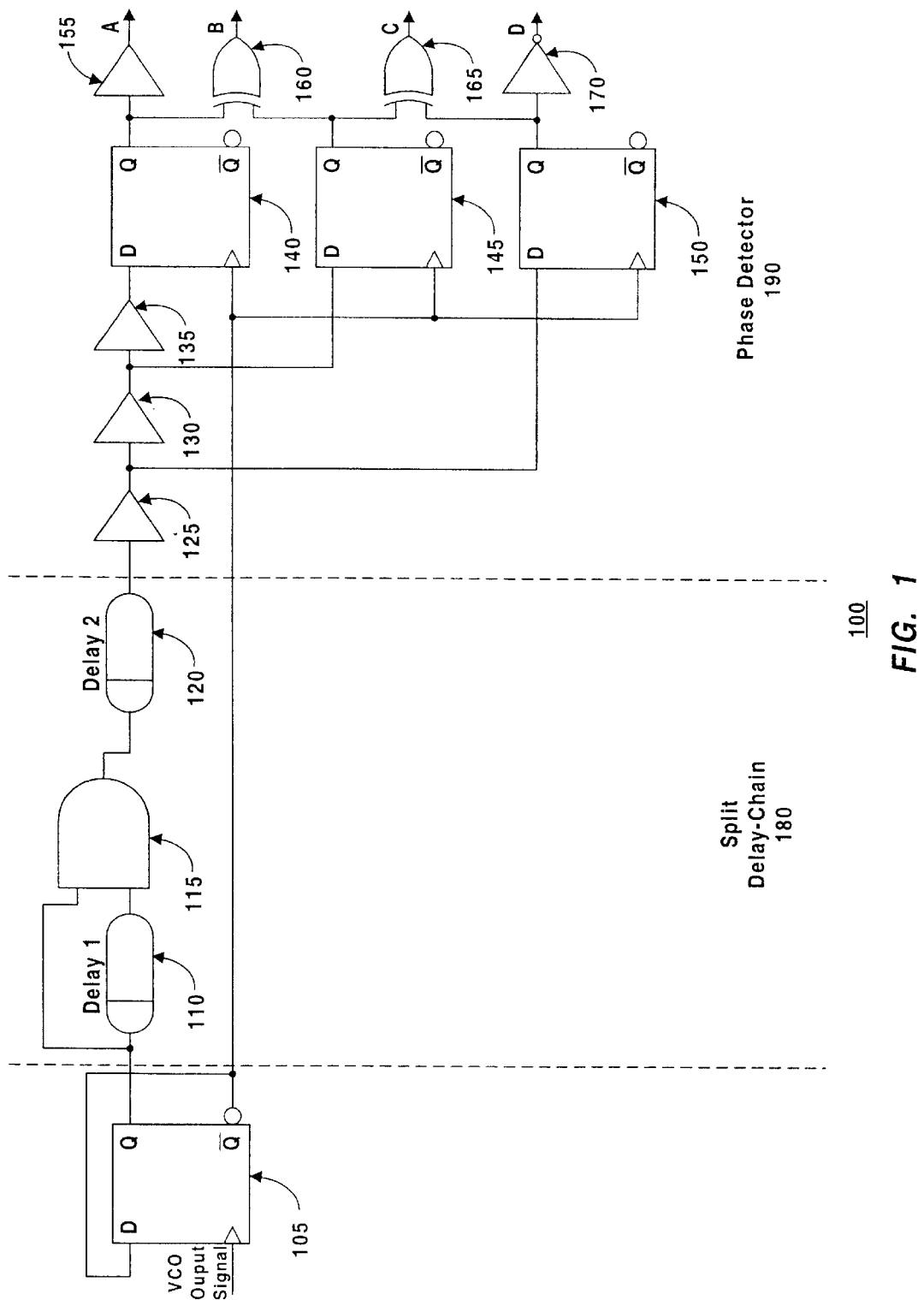
FIG. 1 is a schematic diagram illustrating a portion of an embodiment of a circuit in accordance with the invention.

An alternative embodiment of a split delay-chain, 180, and phase detector, 190, is illustrated in FIG. 1. In this particular embodiment, although the invention is not limited in scope in this respect, split delay-chain 180 is similar to split delay-chain 260. In this regard, phase comparisons and clearing split delay-chain 180 may be accomplished in a similar manner as was previously described. Additionally, distribution of the percentage of total delay among the split delay-chain elements, 110, 115 and 120, may also be accomplished in a similar manner as was previously discussed with respect to embodiment 200, though again, the invention is not limited in scope to this, or any particular split delay-chain configuration.

In this embodiment, phase detector 190 comprises signal buffers 125, 130, 135 and 155; FFs 140, 145 and 150; exclusive-OR (XOR) gates 160 and 165; and inverter 170. These elements are coupled so as to be capable of comparing the phase of a reference version and a delayed version of a signal, such as a clock signal produced by a VCO, for example, as was previously described. Phase detector 190, in this embodiment, is also capable of producing at least four additional control signals. While the invention is not limited in scope to these particular control signals, these signals may be employed to achieve, tune and maintain lock in a clock circuit in a manner that produces improved performance, in comparison to, for example, embodiment 600.

For this embodiment, these control signals may be provided via the output terminals of elements 155, 160, 165 and 170 and, in FIG. 1, are designated A, B, C and D, respectively. These signals may, respectively, indicate a specific adjustment in a VCO oscillation frequency is desired. This indication may be provided via, for example, a filter, in one embodiment. In this particular embodiment, a digital logic value of 1, for A, B, C or D, may indicate a particular frequency adjustment is desired. However, the invention is not limited in scope in this respect and other signaling corrections may be employed. For example, a digital logic value of 0 may be employed alternatively.

As is illustrated in FIG. 1, the data input ports of FFs 140, 145 and 150 receive the delayed version of the VCO output signal from data buffers, 135, 130 and 125, respectively. Because such data buffers typically add delay, there will be some delay between when the delayed signal version becomes present at each of the respective FF input terminals. The invention is, of course, not limited in scope to any particular data buffer configuration or any particular technique for obtaining such signals. Alternatively, inverters may be used in place of data buffers, for example. Phase comparison, for this embodiment, would occur substantially simultaneously for FFs 140, 145 and 150 by employing a reference version of the VCO output signal in a similar manner as was previously described with respect to FIG. 2.

Figure 3:
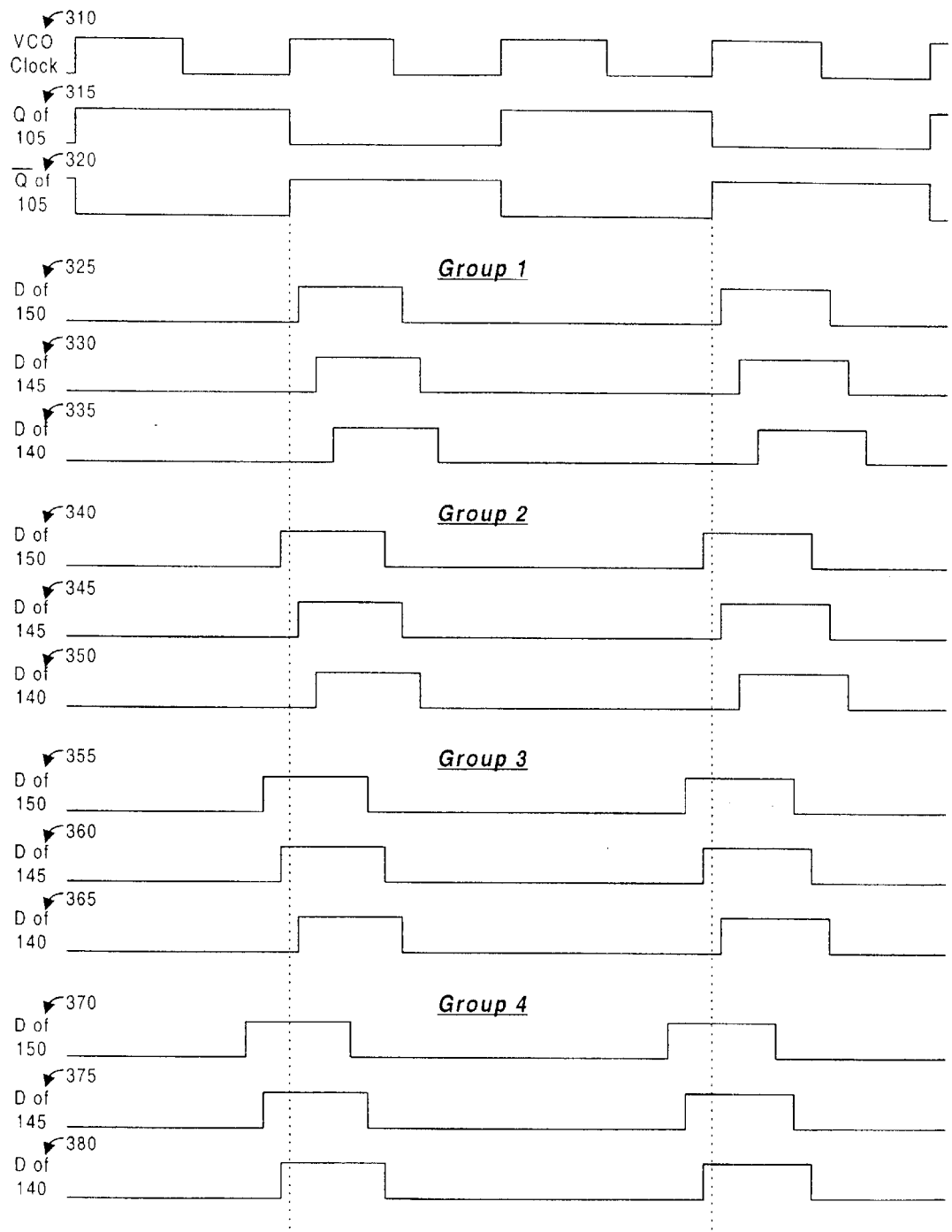
FIG. 3 is a timing diagram illustrating timing relationships for signals that may be generated by the embodiment illustrated in FIG. 1.

In FIG. 3, four possible scenarios of expected timing relationships for a phase comparison that may occur are illustrated. The signals in this timing diagram correspond to embodiment 100. In this timing diagram, signals 310, 315 and 320 illustrate, for embodiment 100, the relationship of the VCO output signal to the signals produced, respectively, by the non-inverted output, Q, and the inverted output, $\overline{Q}$, ports of FF 105. In FIG. 3, Group 1, Group 2, Group 3 and Group 4 designate sets of signals corresponding to these four scenarios. These signal groups merely illustrate the operation of phase detector 190 in embodiment 100 and in no way limit the scope of the invention.

The signal groups in FIG. 3 demonstrate situations when the clock circuit may be locked or in close proximity to achieving lock. In FIG. 3, the dotted lines drawn through the signal groups indicate when, for this embodiment, phase comparisons employing the FFs of phase detector 190 may occur. Here, these comparisons may occur, for example, on the rising edge of the reference version, which is the signal produced on $\overline{Q}$ of FF 105 for this particular embodiment.

Group 1 demonstrates a situation when the delayed version of the VCO output signal is not applied to any of the FFs in phase detector 190, although the reference version of the VCO output signal is applied to all FFs in the phase detector. For this particular embodiment, this situation may indicate that a strong decrease in the oscillation frequency of the VCO is desired because the VCO output signal period is less than desired, or running at a higher than desired frequency. Group 2 demonstrates a situation when the delayed version of the VCO output signal is applied to the FF with the least delay in the prior signal path when the reference version of the VCO output signal is applied to the FFs in the phase detector. For this embodiment, this scenario may indicate a weak decrease in VCO output signal frequency is desired. Group 3 demonstrates a situation when the delayed version of the VCO output signal is applied to some, but not all, of the FFs in the phase detector, here, the two FFs with the least delay in the prior signal path, when the reference version of the VCO is applied the phase detector. For this embodiment, this scenario may indicate a weak increase in the frequency of VCO output signal is desired. Group 4 illustrates a situation where the delayed version of the VCO output signal is present at all of the phase detector FFs when the reference version of the VCO output signal is applied to the phase detector. For this embodiment, this scenario may indicate that a strong increase in the frequency may be desired.

For this particular embodiment, a clock circuit employing such an embodiment may be locked when, over a given time, an approximately equal number of indications of weak increase and weak decrease occur. Of course, the invention is not limited in this respect, and other techniques for achieving lock exist. For example, a phase detector may be configured to provide a digital logic signal that indicates the clock circuit is locked, rather than alternating between providing indications that weak increases and decreases in, for example, VCO frequency are desired.

Figure 4:
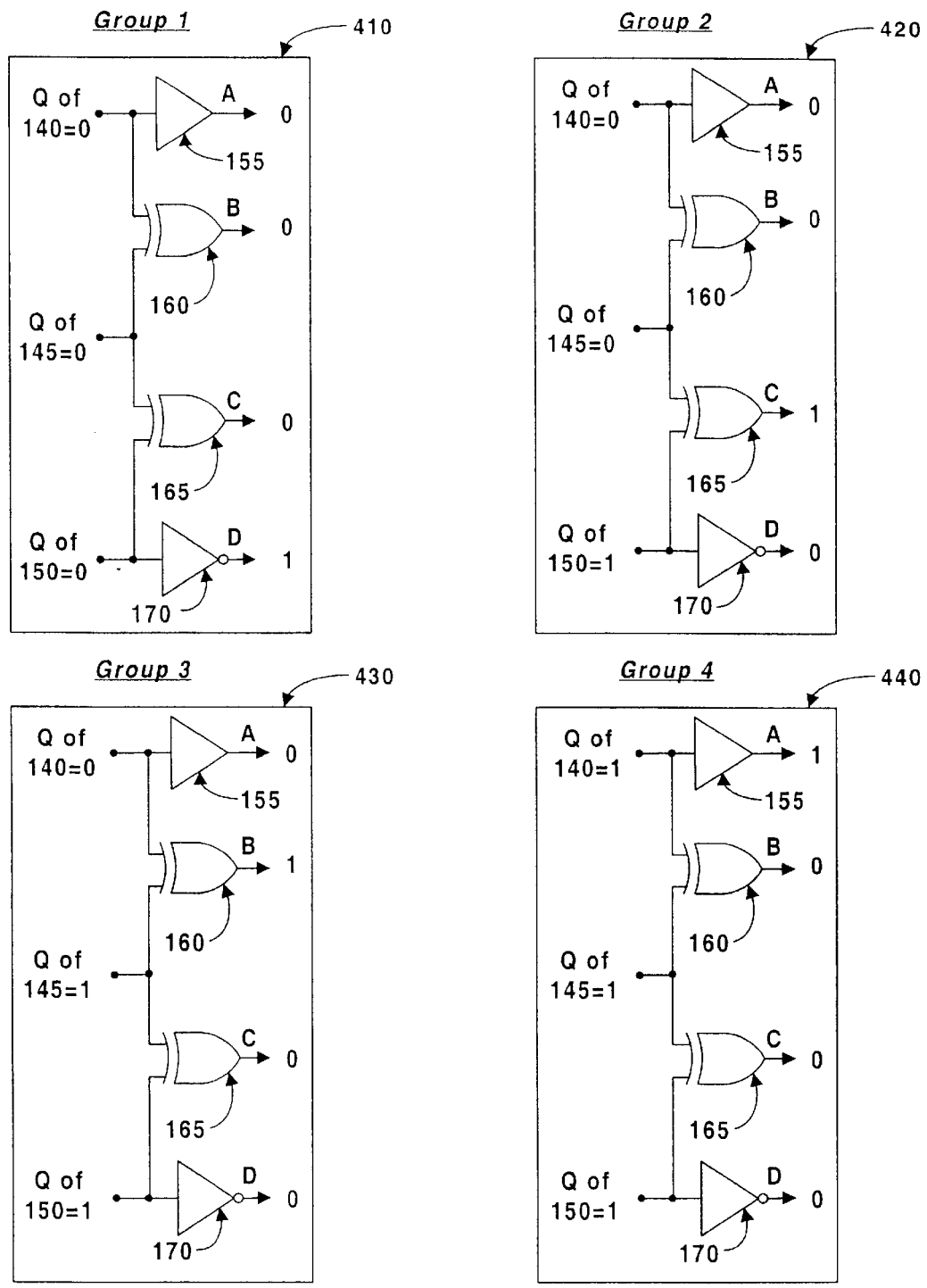
FIG. 4 illustrates a portion of the embodiment shown in FIG. 1 under various operating conditions. The signal groups shown in FIG. 4 correspond to the signal groups of the same designations shown in FIG. 3.

FIG. 4 illustrates, in greater detail, a portion of phase detector 190 and how each of the adjustment indications described above may be produced in embodiment 100. The Group designations in FIG. 4 correspond to the groups of FIG. 3. The signals designated A, B, C, and D, may indicate, respectively, that it is desired to strongly increase VCO frequency, weakly increase VCO frequency, weakly decrease VCO frequency or strongly decrease VCO frequency, corresponding to the four scenarios described above. The operation of digital logic gates, such as those illustrated in FIG. 4, are well-known. As was also previously discussed, techniques for increasing and decreasing the oscillation frequency of a VCO are well-known in the art and the invention is not limited in scope to the use of any particular technique or particular VCO configuration.

Figure 7:
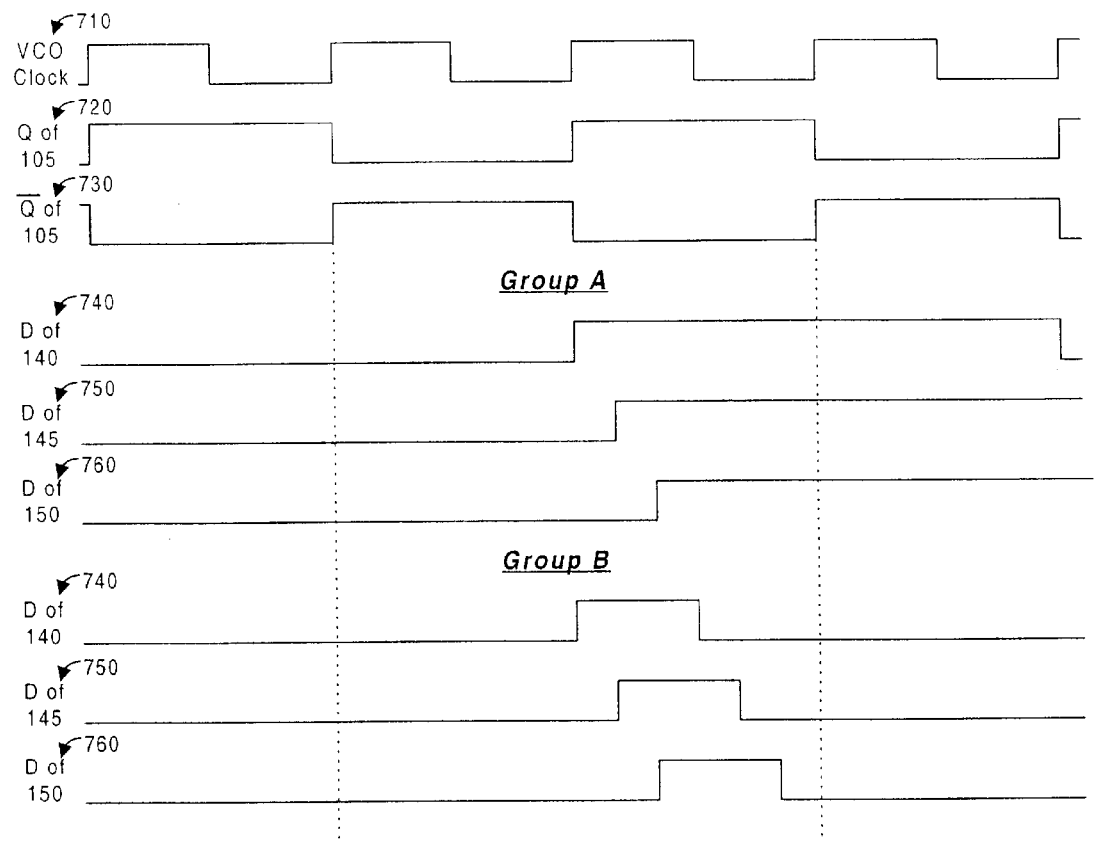
FIG. 7 is a timing diagram illustrating an example of a phase comparison error in a clock circuit.

FIG. 7 illustrates that embodiments such as 100 may reduce phase comparison errors. Signal groups A and B illustrate a scenario with a VCO running at substantially two times its target frequency, for example. For Group A, it is presumed that an embodiment without a split delay-chain is employed, while for Group B, it is presumed that an embodiment with a split delay-chain is employed. In the situation illustrated by Group A, because the VCO is running at substantially two times the target frequency, the phase detector may not detect the error and may inadvertently increase the VCO frequency. The increase may occur in a manner substantially similar as described with respect to FIG. 4. Of course, other types of phase comparison errors exist and techniques to reduce the risk of such errors may depend, at least in part, on the particular embodiment.

In contrast, in this scenario, Group B in FIG. 7 illustrates that employing a split delay-chain may avoid this undesirable outcome. In embodiments, such as 100, for example, clearing the split delay-chain may allow the phase detector to detect an error, such as the VCO frequency being too high, and appropriately reduce the VCO frequency. This is a desired outcome given a VCO running at two times the target frequency for a particular embodiment.

An embodiment of a method for generating a clock signal in accordance with the invention may include propagating an electronic signal, such as a delayed version of a VCO output signal, for example, and comparing the phase relationship of this electronic signal with a reference version of the clock signal. The invention is, of course, not limited in scope to any particular technique of producing a delayed version or a reference version of a VCO output signal. Such a method may further include adjusting the frequency of a VCO output signal based, at least part, on the results of a phase comparison.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

APPENDIX A

I hereby appoint BLAKELY, SOKOLOFF, TAYLOR & ZAFMAN LLP, a firm including: William E. Alford, Reg. No. 37,764; Farzad E. Amini, Reg. No. 42,261; Amy M. Armstrong, Reg. No. 42,265; Aloysius T. C. AuYeung, Reg. No. 35,432; William Thomas Babbitt, Reg. No. 39,591; Carol F. Barry, Reg. No. 41,600; Jordan Michael Becker, Reg. No. 39,602; Bradley J. Bereznak, Reg. No. 33,474; Michael A. Bernadicou, Reg. No. 35,934; Roger W. Blakely, Jr., Reg. No. 25,831; Gregory D. Caldwell, Reg. No. 39,926; Ronald C. Card, Reg. No. 44,587; Thomas M. Coester, Reg. No. 39,637; Donna Jo Coningsby, Reg. No. 41,684; Michael Anthony DeSanctis, Reg. No. 39,957; Daniel M. De Vos, Reg. No. 37,813; Robert Andrew Diehl, Reg. No. 40,992; Matthew C. Fagan, Reg. No. 37,542; Tarek N. Fahmi, Reg. No. 41,402; George L. Fountain, Reg. No. 36,374; Paramita Ghosh, Reg. No. 42,806; James Y. Go, Reg. No. 40,621; James A. Henry, Reg. No. 41,064; Willmore F. Holbrow III, Reg. No. 41,845; Sheryl Sue Holloway, Reg. No. 37,850; George W Hoover II, Reg. No. 32,992; Eric S. Hyman, Reg. No. 30,139; William W. Kidd, Reg. No. 31,772; Sang Hui Kim, Reg. No. 40,450; Walter T. Kim, Reg. No. 42,731; Eric T. King, Reg. No. 44,188; Erica W. Kuo, Reg. No. 42,775; Michael J. Mallie, Reg. No. 36,591; Paul A. Mendonsa, Reg. No. 42,879; Clive D. Menezes, Reg. No. 45,493; Darren J. Milliken, Reg. No. 42,004; Chun M. Ng, Reg. No. 36878; Thien T. Nguyen, Reg. No. 43,835; Thinh V. Nguyen, Reg. No. 42,034; Dennis A. Nicholls, Reg. No. 42,036; Lisa A. Norris, Reg. No. 44,976; Daniel E. Ovanezian, Reg. No. 41,236; William F. Ryann, Reg. No. 44,313; James H. Salter, Reg. No. 35,668; William W. Schaal, Reg. No. 39,018; James C. Scheller, Reg. No. 31,195; Jeffrey S. Smith, Reg. No. 39,377; Maria McCormack Sobrino, Reg. No. 31,639; Stanley W. Sokoloff, Reg. No. 25,128; Judith A. Szepesi, Reg. No. 39,393; Vincent P. Tassinari, Reg. No. 42,179; Edwin H. Taylor, Reg. No. 25,129; Joseph A. Twarowski, Reg. No. 42,191; Lester J. Vincent, Reg. No. 31,460; Glenn E. Von Tersch, Reg. No. 41,364; John Patrick Ward, Reg. No. 40,216; Charles T. J. Weigell, Reg. No. 43,398; James M. Wu, Reg. No. 45,241; Steven D. Yates, Reg. No. 42,242; and Norman Zafman, Reg. No. 26,250; my attorneys; and Andrew C. Chen, Reg. No. 43,544; Justin M. Dillon, Reg. No. 42,486; and John F. Travis, Reg. No. 43,203; my patent agents, of BLAKELY, SOKOLOFF, TAYLOR & ZAFMAN LLP, with offices located at 12400 Wilshire Boulevard, 7th Floor, Los Angeles, California 90025, telephone (714) 557-3800, and Alan K. Aldous, Reg. No. 31,905; Robert D. Anderson, Reg. No. 33,826; Joseph R. Bond, Reg. No. 36,458; Richard C. Calderwood, Reg. No. 35,468; Jeffrey S. Draeger, Reg. No. 41,000; Cynthia Thomas Faatz, Reg No. 39,973; Sean Fitzgerald, Reg. No. 32,027; John N. Greaves, Reg. No. 40,362; Seth Z. Kalson, Reg. No. 40,670; David J. Kaplan, Reg. No. 41,105; Charles A. Mirho, Reg. No. 41,199; Leo V. Novakoski, Reg. No. 37,198; Naomi Obinata, Reg. No. 39,320; Thomas C. Reynolds, Reg. No. 32,488; Kenneth M. Seddon, Reg. No. 43,105; Mark Seeley, Reg. No. 32,299; Steven P. Skabrat, Reg. No. 36,279; Howard A. Skaist, Reg. No. 36,008; Steven C. Stewart, Reg. No. 33,555; Raymond J. Werner, Reg. No. 34,752; Robert G. Winkle, Reg. No. 37,474; and Charles K. Young, Reg. No. 39,435; my patent attorneys, and Thomas Raleigh Lane, Reg. No. 42,781; Calvin E. Wells; Reg. No. P43,256, Peter Lam, Reg. No. 44,855; and Gene I. Su, Reg. No. 45,140; my patent agents, of INTEL CORPORATION; and James R. Thein, Reg. No. 31,710, my patent attorney; with full power of substitution and revocation, to prosecute this application and to transact all business in the Patent and Trademark Office connected herewith.

INTEL CORPORATION
Rev. 09/09/99 (D3 INTEL)

Docket No. 042390.P6511

What is claimed is:

1. A component comprising:

a split delay-chain; and a phase detector;

said split delay-chain and phase detector being coupled so as to compare a phase relationship of two oscillating signals to be applied to said split delay-chain and said phase detector;

wherein said split delay-chain comprises a plurality of delays and logic circuitry coupled so as to be capable of clearing said split delay-chain.

2. A device comprising:

a split delay-chain;

a phase detector; and a voltage controlled oscillator (VCO);

said split delay-chain, phase detector and VCO being coupled together to form a clock circuit;

wherein said split-delay chain comprises at least two delays and logic circuitry coupled so as to be capable of clearing said split delay-chain.

3. The device of claim 2, wherein said at least two delays and said logic circuitry are further coupled so as to clear said split delay-chain based, at least in part, on an output signal of said VCO.

4. The device of claim 2, wherein said at least two delays comprise circuitry coupled so as to be capable of propagating signals there through in a time period substantially equivalent to a substantially predetermined target clock period for said clock circuit.

5. The device of claim 4, wherein said phase detector and said split delay-chain are coupled so as to be capable of comparing a phase relationship of a reference version of an output signal of said VCO with a delayed version of said output signal of said VCO.

6. The device of claim 5, further comprising:

logic circuitry, said logic circuitry being coupled to said VCO, said split delay-chain and said phase detector, so as to provide signals with a proper phase relationship in order to be compared.

7. The device of claim 5, wherein said phase detector is further capable of providing control signals, said control signals being dependent, at least in part, on a phase relationship comparison and said phase detector being coupled so as to modify an oscillation frequency of said VCO based, at least in part, on said control signals.

8. A method of adjusting a clock signal comprising:

propagating a delayed version of the clock signal, comparing a phase relationship of the clock signal with the delayed version, clearing the delayed version so as to result in a reduced duty cycle for the delayed version, and adjusting the clock signal frequency based, at least in part, on the phase relationship.

9. The method of claim 8, further comprising:

increasing the clock signal frequency if the phase relationship indicates the clock signal is oscillating at a frequency slower than a predetermined target frequency.

10. The method of claim 9, further comprising:

decreasing the clock signal frequency if the phase relationship indicates the clock signal is oscillating at a frequency faster than a predetermined target frequency.

11. The method of claim 8, wherein clearing the delayed version occurs on alternative phases of the clock signal.

12. The method of claim 8, wherein clearing of the delayed version results in the delayed version having a duty cycle of not more than 25%.

* * * * *